United States Patent
Wyville

(10) Patent No.: US 9,627,738 B2
(45) Date of Patent: Apr. 18, 2017

(54) WIDEBAND MULTILAYER TRANSMISSION LINE TRANSFORMER

(75) Inventor: Mark William Wyville, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 292 days.

(21) Appl. No.: 13/351,062

(22) Filed: Jan. 16, 2012

(65) Prior Publication Data
US 2013/0181803 A1 Jul. 18, 2013

(51) Int. Cl.
| H01F 5/00 | (2006.01) |
|---|---|
| H01F 27/28 | (2006.01) |
| H01P 5/02 | (2006.01) |
| H01F 19/04 | (2006.01) |
| H01P 5/10 | (2006.01) |
| H03H 7/42 | (2006.01) |

(52) U.S. Cl.
CPC ............ *H01P 5/02* (2013.01); *H01F 19/04* (2013.01); *H01P 5/10* (2013.01); *H03H 7/42* (2013.01); *H03H 7/422* (2013.01); *Y10T 29/4902* (2015.01)

(58) Field of Classification Search
None
See application file for complete search history.

(56) References Cited

U.S. PATENT DOCUMENTS

| 5,420,558 | A | 5/1995 | Ito et al. |
| 6,396,362 | B1 | 5/2002 | Mourant et al. |
| 7,183,872 | B2 * | 2/2007 | Lee et al. ............. 333/26 |
| 7,656,262 | B2 * | 2/2010 | Muto .................. 336/200 |
| 2001/0054947 | A1 | 12/2001 | Buckles et al. |
| 2003/0134612 | A1 * | 7/2003 | Nakayama et al. ....... 455/307 |
| 2009/0108978 | A1 * | 4/2009 | Loke et al. ............ 336/200 |
| 2011/0043316 | A1 * | 2/2011 | Yang et al. ............ 336/192 |

FOREIGN PATENT DOCUMENTS

| GB | 1440304 A1 | 6/1976 |
| JP | 2002033216 A1 | 1/2002 |
| WO | 9624964 A1 | 8/1996 |
| WO | 2005027156 A2 | 3/2005 |
| WO | 2011008866 A1 | 1/2011 |

OTHER PUBLICATIONS

English translation of JP2002033216.*
(Continued)

*Primary Examiner* — Elvin G Enad
*Assistant Examiner* — Ronald Hinson
(74) *Attorney, Agent, or Firm* — Christopher & Weisberg, P.A.

(57) ABSTRACT

Embodiments of the invention include transmission line transformers. According to one aspect, a multilayer transmission line transformer (TLT) includes a first set of two conductors forming a first clockwise spiral. The TLT includes a second set of two conductors forming a second counterclockwise spiral that is substantially coaxial with the first spiral. The first and second spirals are arranged to cause a substantial cancellation of common mode currents in the first and second sets of conductors during operation of the TLT.

14 Claims, 9 Drawing Sheets

(56) References Cited

OTHER PUBLICATIONS

Written Opinion of the International Preliminary Examining Authority dated Dec. 20, 2013 for International Application No. PCT/IB2012/056466, International Filing Date Nov. 11, 2012 consisting of 21-pages.
International Search Report and Written Opinion dated Mar. 26, 2013 for International Application S/N: PCT/IB2012/056466; International Filing Date: Nov. 15, 2012 consisting of 22-pages.
International Preliminary Report on Patentability dated Apr. 17, 2014 for International Application No. PCT/IB2012/056466, International Filing Date Nov. 11, 2012 consisting of 65-pages.

* cited by examiner

WIDEBAND MULTILAYER TRANSMISSION LINE TRANSFORMER

TECHNICAL FIELD

The present invention relates to electrical transformers, and in particular relates to transmission line transformers.

BACKGROUND

Transformers are used in electronic systems for transforming impedances, interfacing balanced and unbalanced components, power splitting and combining, signal inversion, direct current blocking and delay lines. Four exemplary types of transformers are magnetic flux linkage transformers, lumped-component transformers, resonant transmission line transformers (TLT), and non-resonant TLTs. Non-resonant TLTs exhibit lower insertion loss and have wider bandwidth than magnetic flux linkage transformers and lumped-component transformers at radio frequencies (RF). The length of non-resonant TLTs is typically less than $\lambda_{min}/8$ where $\lambda_{min}$ is the wavelength of the highest frequency in the operating bandwidth of the TLT. The length of the resonant TLTs is typically $\lambda_{center}/4$ where $\lambda_{center}$ is the wavelength of the center frequency of the operating bandwidth of the TLT. Therefore, non-resonant TLTs are typically physically smaller than resonant TLTs. Smaller size is generally preferred. For at least these reasons, non-resonant TLTs exhibit preferred performance as compared to resonant TLTs.

However, non-resonant TLTs are difficult to integrate into printed circuit boards. Non-resonant TLTs have 1 or more 2-wire transmission lines. Each 2-wire transmission line is typically less than $\lambda_{min}/8$. Criteria for successful operation of a non-resonant TLT include that: (1) at least one of the 2-wire transmission lines should exhibit very high common-mode impedance, and (2) the differential-mode impedance should be some function of the source and load impedances and of the TLT configuration.

Optimal differential-mode impedance is typically not difficult to realize. However, a very high-common mode impedance is difficult to realize with strip line circuitry. The achievable common mode impedance determines the lowest operating bandwidth of the non-resonant TLT. Very high common mode impedance has been achieved over a large bandwidth by wrapping a transmission line around a ferrite core or by use of ferrite beads. However, these types of construction are not compatible with the integration requirements of modern telecommunications radios Attempts have been made to design non-resonant TLTs with the use of strip line to permit integration on printed circuit boards. FIG. 1 is a diagram of a Guanella TLT 100, which is a 2-wire transmission line that may exhibit a high common mode impedance. In FIG. 1, a first conductor 18 and a second conductor 20 are substantially physically parallel. FIG. 2 is an inductive circuit that represents a Guanella TLT of which the configuration of FIG. 1, is but one example. Note that the input and output ports are indicated by reference numerals 1 through 4. FIG. 3 shows a second order Guanella TLT 160 and FIG. 4 is an inductive circuit that represents a second order Guanella TLT of which the configuration of FIG. 3 is but one example. The second order Guanella TLT 160 has a first set of two substantially physically parallel conductors 18 and 20. TLT 160 also has a second pair of substantially physically parallel conductors 22 and 24. The conductor 18 provides an input 26 and the conductors 18 and 24 provide an output 28. Conductors 18 and 22 are coplanar and conductors 20 and 24 are also coplanar, but in a different plane.

FIG. 5 is a Ruthroff TLT 30. FIG. 6 is an inductive circuit that represents a Ruthroff TLT of which the configuration of FIG. 5 is but one example. The TLT 30 includes two edge coupled conductors 32 and 34. The Ruthroff configuration of FIG. 6 typically has a lower frequency limit of operation than the Guanella configuration of FIG. 2. Note that both the Ruthroff and Guanella TLTs can be constructed with edge coupled conductors.

Combinations of the basic elements of FIGS. 2, 4 and 6, may be used as transformers, baluns, combiners and splitters. However, a high common mode impedance over a large bandwidth is difficult to achieve with the basic Guanella and Ruthroff elements when implemented with strip line techniques. When high common mode impedance is not realized over a large bandwidth, the resultant bandwidth of the non-resonant TLT will not be large.

Techniques for increasing the common-mode impedance of a 2-conductor stripline have been applied to non-resonant TLTs. A first technique is based on the relationship that maximizing the common-mode impedance of coupled transmission lines corresponds to maximizing the coupling coefficient between these lines. Increased coupling is achieved by vertically stacking two physically parallel conductors, which is known as broadside coupling and is shown in FIG. 1.

In addition to broadside coupling, various strip line parameters can be optimized to permit stronger coupling, such as: increasing the distance between the ground plane and the transmission lines, and decreasing the distance between the transmission lines. A problem with this technique is that the impedances of the common- and differential modes cannot be chosen independently. So maximizing the common-mode impedance does not ensure that constraints on the differential-mode can be met.

Another technique involves increasing the inductance of the common-mode currents by wrapping the two parallel conductors into a spiral shape (planar or multilayer), like an inductor. This wrapping is shown in FIG. 1 for broadside-coupled lines, and in FIG. 5 for edge-coupled lines. The impedance of an inductor is: $j2\pi fL$, ($j=\sqrt{-1}$, f is frequency, L is inductance), which shows that increasing the inductance increases the impedance. The differential-mode currents are not significantly affected by the wrapping of the lines. The drawback of this technique is that to achieve a high impedance for low frequencies, then the inductance must be very large. To increase the common-mode inductance of a pair of spiraled parallel conductors, the number of turns and/or outer circumference of the spiral must increase. Both of these modifications increase the length of the non-resonant TLT which increases the insertion loss at all frequencies.

Therefore, what are needed are non-resonant TLT configurations that increase common mode impedance and that are manufacturable using printed circuit techniques.

SUMMARY

Embodiments of the invention include transmission line transformers. According to one aspect, a multilayer transmission line transformer (TLT) includes a first set of two conductors forming a first clockwise spiral. The TLT includes a second set of two conductors forming a second counterclockwise spiral that is substantially coaxial with the first spiral. The first and second spirals are arranged to cause a substantial cancellation of common mode currents in the first and second sets of conductors during operation of the TLT.

According to another aspect, the invention provides a transformer that includes first, second, third and fourth conductors. The first conductor is in a first plane and forms a first clockwise spiral. The second conductor forms a second clockwise spiral that is substantially coaxial with the first spiral. The third conductor forms a third counterclockwise spiral that is substantially coaxial with the first spiral. The third conductor is in a second plane that is substantially parallel to the first plane. The fourth conductor forms a fourth counterclockwise spiral that is substantially coaxial with the third spiral.

According to another aspect, the invention provides a transformer that includes first, second, third and fourth conductors. The first conductor forms a first inductor having a first inductive reactance. The second conductor forms a second inductor having a second inductive reactance that is mutually coupled to the first inductive reactance. The third conductor forms a third inductor having a third inductive reactance that is electrically in parallel with the first inductive reactance. The fourth conductor forms a fourth inductor having a fourth inductive reactance that is electrically parallel with the second inductive reactance and is mutually coupled to the third inductive reactance.

According to another aspect, the invention provides a method of manufacturing a wideband multilayer transmission line transformer. The method includes forming a first pair of conductors on opposite sides of a first dielectric, where the first pair of conductors form a first spiral oriented in a first direction. A second pair of conductors is formed on opposite sides of a second dielectric. The second dielectric is substantially parallel to the first dielectric. The second pair of conductors form a second spiral oriented in a second direction, the second spiral being substantially coaxial with the first spiral. The first pair of conductors and the second pair of conductors generate oppositely directed magnetic fields to substantially cancel common mode currents in each of the first pair of conductors and the second pair of conductors when in operation.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
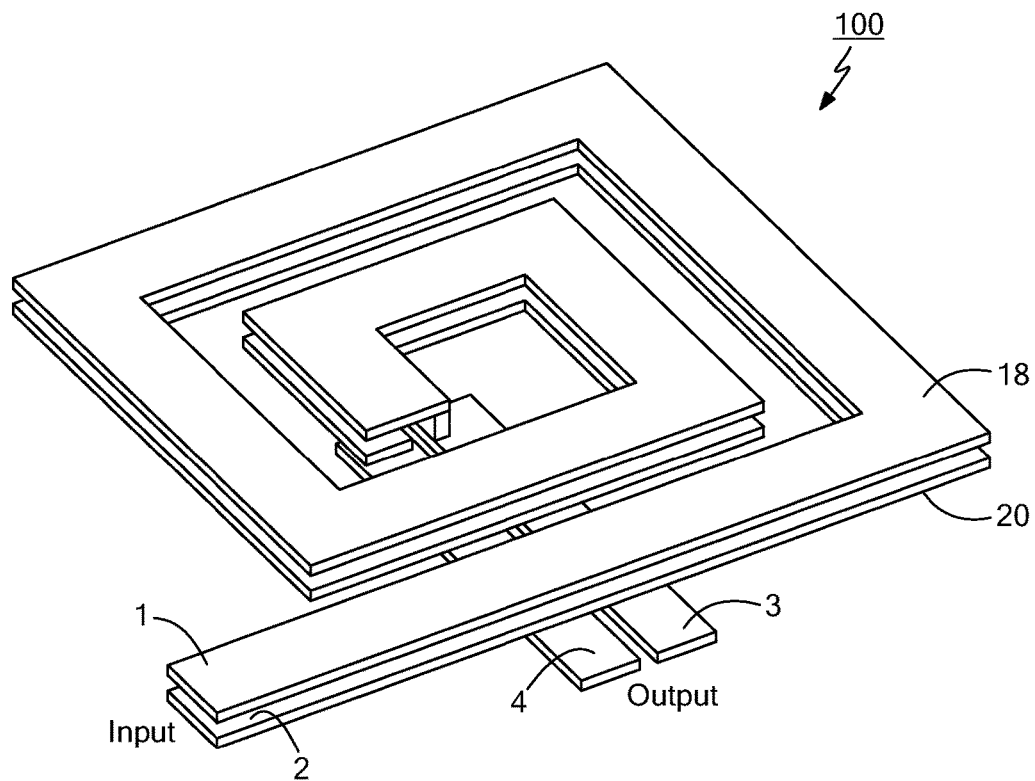
FIG. 1 is a diagram of a known Guanella type transmission line transformer (TLT)
Figure 2:
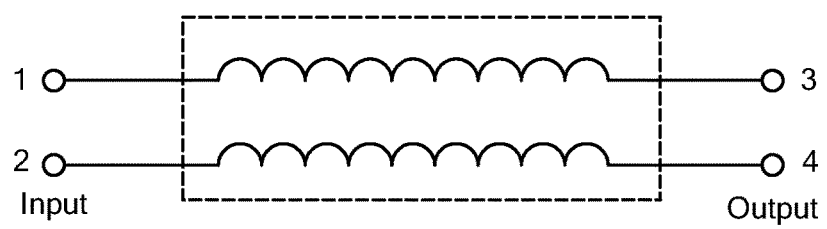
FIG. 2 is a circuit equivalent to the TLT of FIG. 1.

Before describing in detail exemplary embodiments that are in accordance with the present invention, it is noted that the embodiments reside primarily in combinations of apparatus components and processing steps related to forming transmission line transformers. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Figure 7:
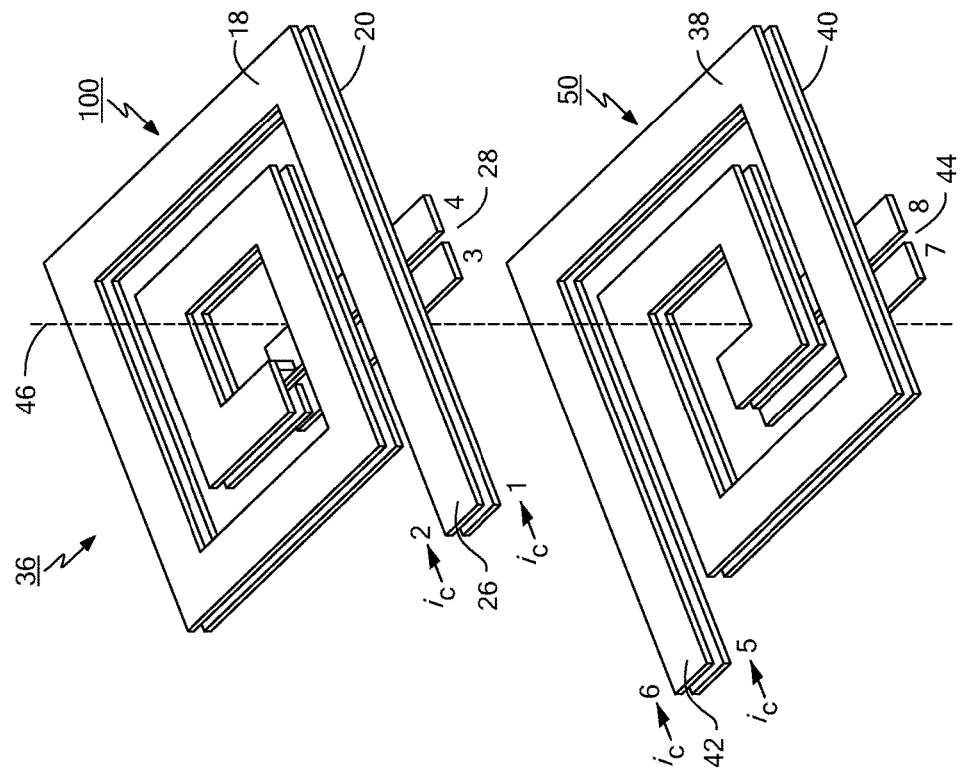
FIG. 7 is a diagram of a multilayer TLT constructed in accordance with principles of the present invention.

Referring now to the drawing figures, in which like reference designators denote like elements, there is shown in FIG. 7 an exemplary embodiment of a transmission line transformer (TLT) 36 constructed in accordance with principles of the present invention. The TLT 36 includes two sets of conductors 18 and 20 similar to the conductors 18 and 20 of FIG. 1 forming a Guanella type TLT 100 such as the TLT 100 of FIG. 1. Physically parallel to TLT 100 is a second TLT 50 formed by two conductors 38 and 40. The TLT 100 is oriented counterclockwise and the TLT 50 is oriented clockwise. TLT 100 and TLT 50 are substantially coaxial as shown by the dashed line 46. Persons of ordinary skill in the art will recognize that, in an equivalent structure, TLT 100 may be oriented clockwise and TLT 50 may be oriented counterclockwise.

Figure 8:
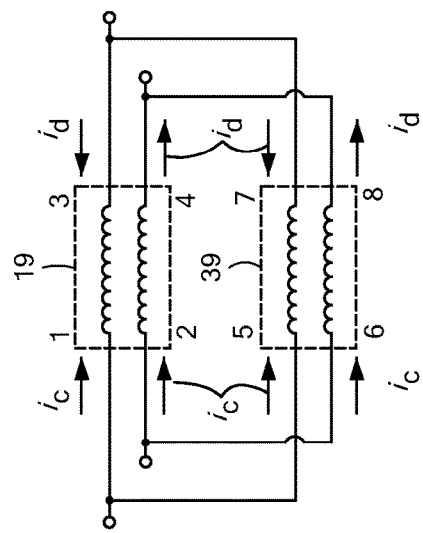
FIG. 8 is a circuit equivalent to the TLT of FIG. 7.

In the arrangement of FIG. 7, ports 1 and 2, 26, are input ports and ports 5 and 6, 42, are also input ports. Ports 3 and 4, 28, are output ports and ports 7 and 8, 44, are also output ports. Certain connections between ports are not shown in FIG. 7, for clarity. Rather, the port connections are shown in FIG. 8, which is a diagram of a circuit that is equivalent to the circuitry of FIG. 7. As shown in FIG. 8, port 1 is connected to port 5, port 2 is connected to port 6, port 3 is connected to port 7 and port 4 is connected to port 8. The first two conductors 18 and 20 form a first pair of mutually coupled inductive reactances 19, and the second two conductors 38 and 40 form a second pair of mutually coupled inductive reactances 39.

Thus, one embodiment is a multilayer transmission line transformer that includes a first set of two conductors forming a first clockwise spiral, and a second set of two conductors forming a second counterclockwise spiral that is substantially coaxial with the first clockwise spiral. The first and second spirals are arranged to cause a substantial cancellation of common mode currents in the first and second sets of conductors during operation. In particular, the ports of the two spirals are connected to form electrically parallel inductors whose magnetic fields suppress the common mode currents.

In FIG. 8, the reference designator $i_c$ denotes a common mode current, and the reference designator $i_d$ denotes a differential mode current. The orientation of the two Guanella type TLTs 100 and 50 result in magnetic fields of each TLT interacting so as to cause substantial cancellation of the common mode currents. To ensure that the differential mode impedance is not significantly affected by the addition of the second pair of lines of TLT 50, the distance between the first pair of lines 18 and 20 and the second pair of lines 38 and 40 should be greater than the distance between the lines within each pair.

Note that the distance between the TLTs 100 and 50 may be substantially greater than a distance between the conductors 18 and 20 that form the TLT 100, and may be substantially greater than a distance between the conductors 38 and 40 that form the TLT 50.

Figure 9:
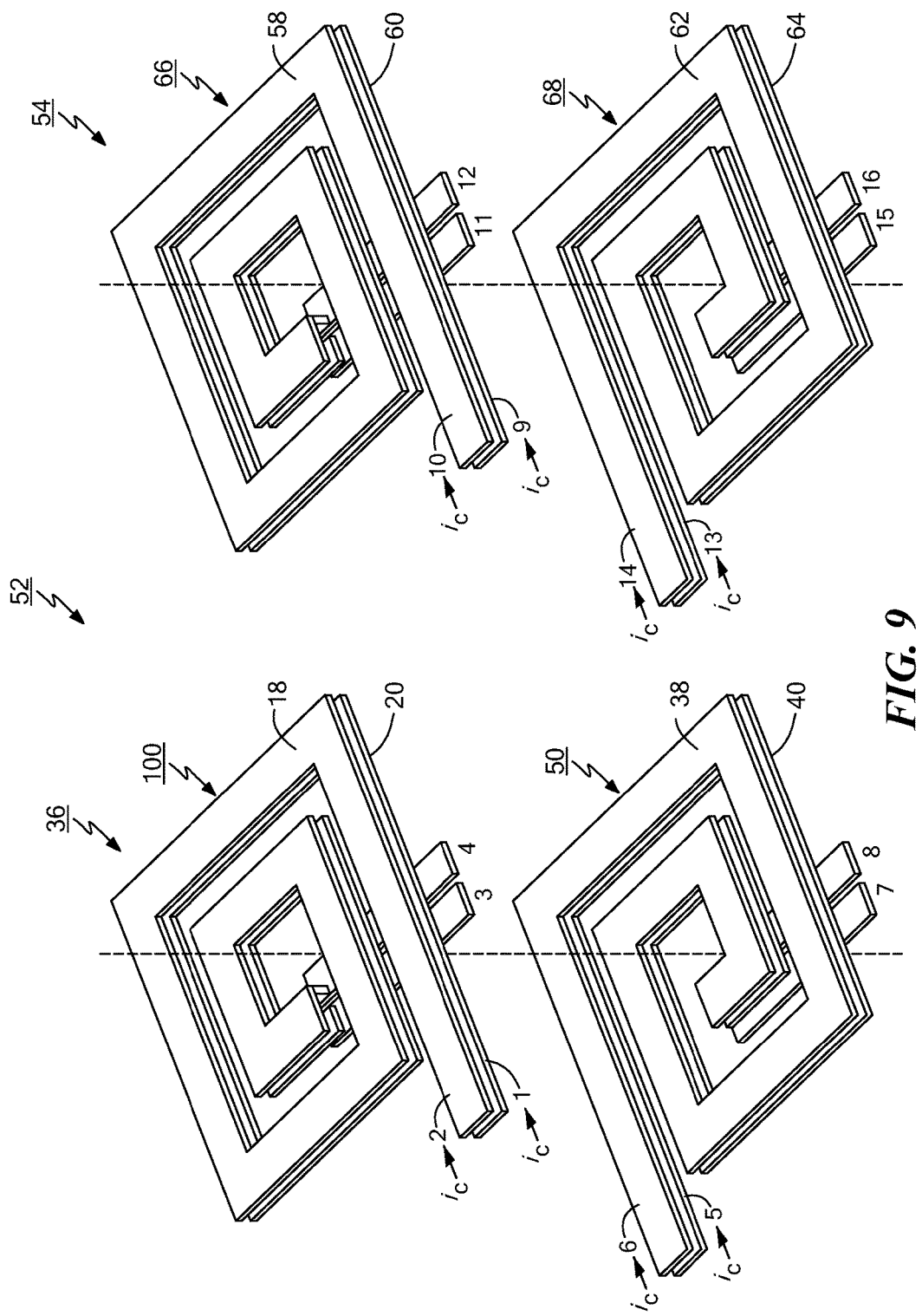
FIG. 9 is a diagram of a multilayer TLT constructed in accordance with principles of the present invention.

FIG. 9 shows a higher order TLT 52 that includes a first pair of TLTs 100 and 50 and a second pair of TLTs 66 and 68. The TLT 66 is coplanar with the TLT 100 and the TLT 68 is coplanar with the TLT 50. The TLT 66 is oriented counterclockwise and the TLT 68 is oriented clockwise. Further, the TLTs 66 and 68 are substantially coaxial. The TLT 66 includes a pair of conductors 58 and 60 the TLT 68 includes a pair of conductors 62 and 64. The conductors 58 and 60 are separated by a distance that is smaller than a distance between the TLTs 66 and 68. Similarly, the conductors 62 and 64 are separated by a distance that is smaller than the distance between the TLTs 66 and 68.

Figure 10:
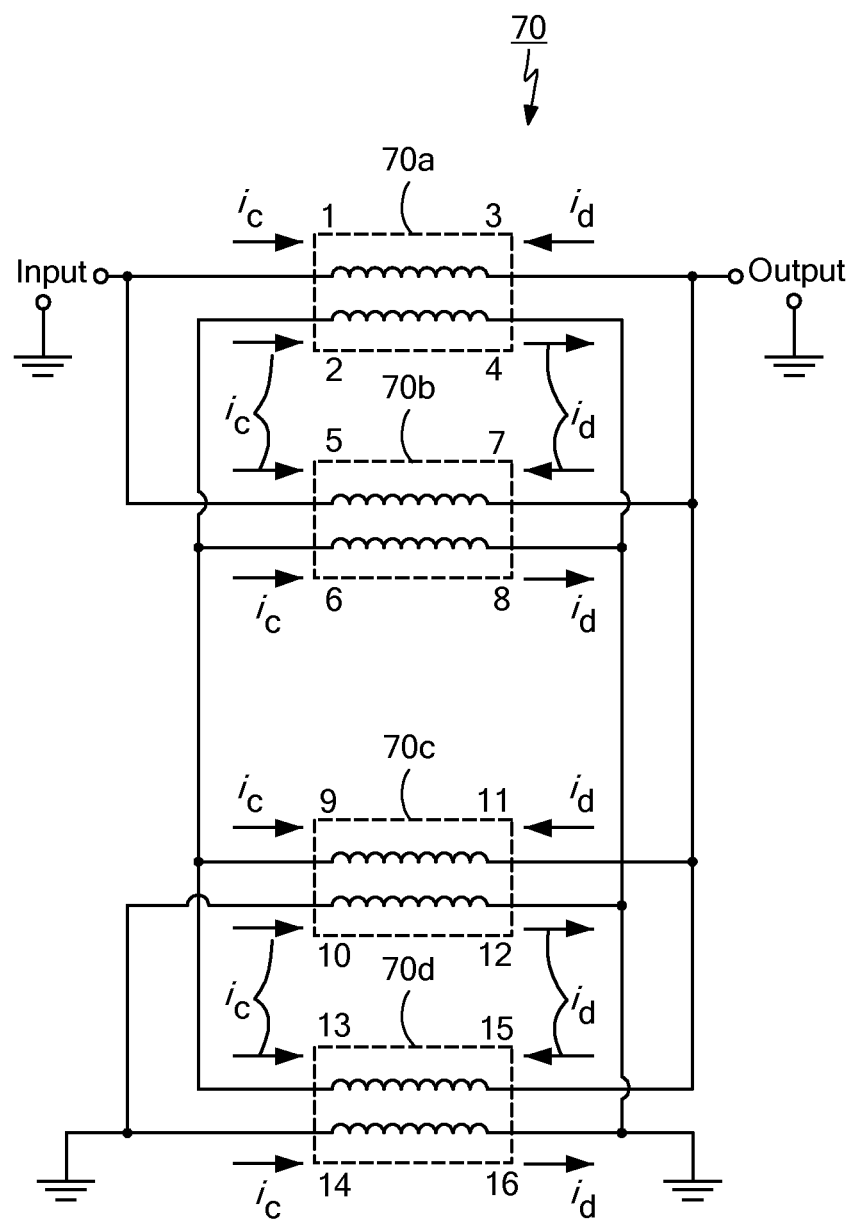
FIG. 10 is a circuit equivalent to the TLT of FIG. 9.

FIG. 10 is an equivalent circuit diagram 70 for the configuration of FIG. 9. The input ports, as shown in FIGS. 9 and 10, are ports 1 and 5. The output ports are ports 3, 7, 11 and 15. In particular, port 1 is connected to port 5, port 2 is connected to ports 6, 9 and 13, port 10 is connected to port 14, port 3 is connected to ports 7, 11 and 15, and port 4 is connected to ports 8, 12 and 16, and a ground plane.

Note that conductors 18 and 20 form a first pair of mutually coupled inductive reactances 70a. Conductors 38 and 40 form a second pair of mutually coupled inductive reactances 70b. Similarly, conductors 58 and 60 form a third pair of mutually coupled inductive reactances 70c, and conductors 62 and 64 form a fourth pair of mutually coupled inductive reactances 70d.

Figure 3:
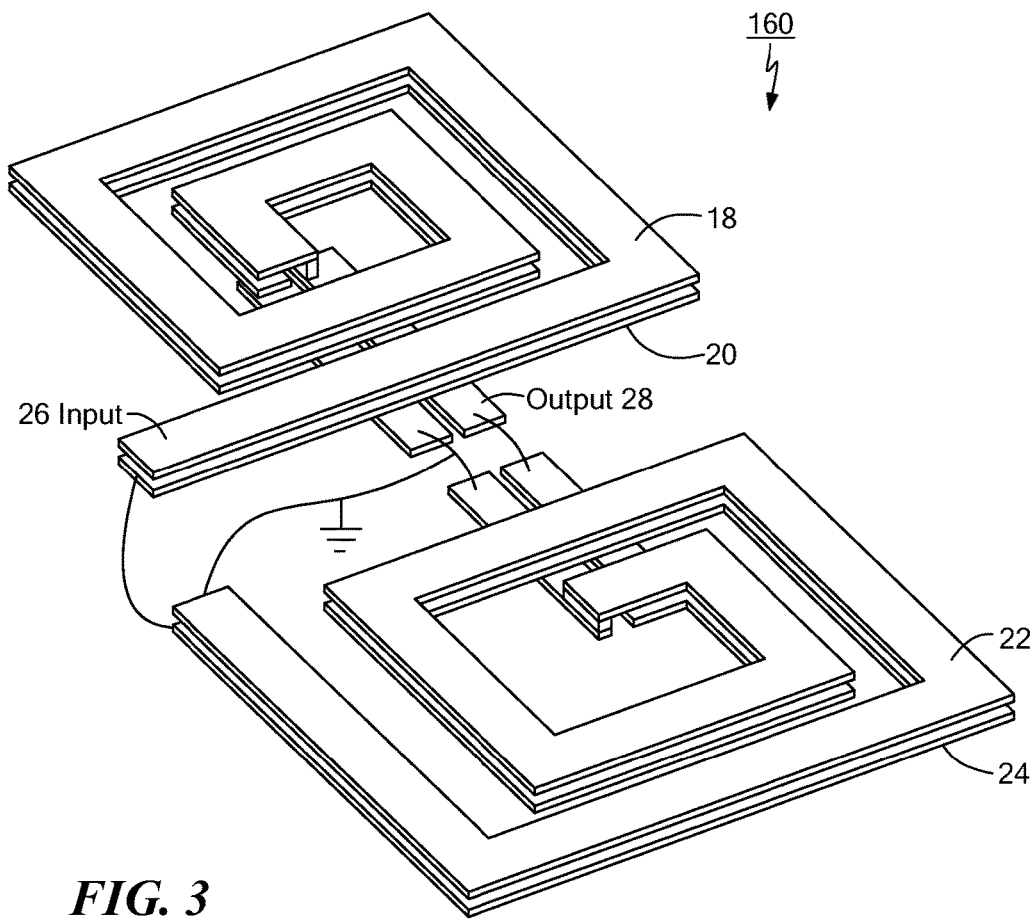
FIG. 3 is a diagram of a known higher order Guanella type TLT.
Figure 4:
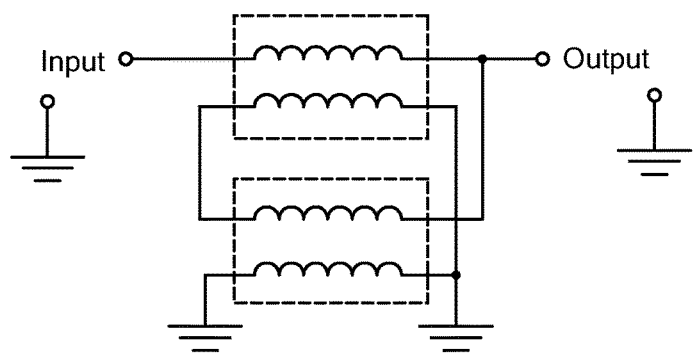
FIG. 4 is a circuit equivalent to the TLT of FIG. 3.
Figure 5:
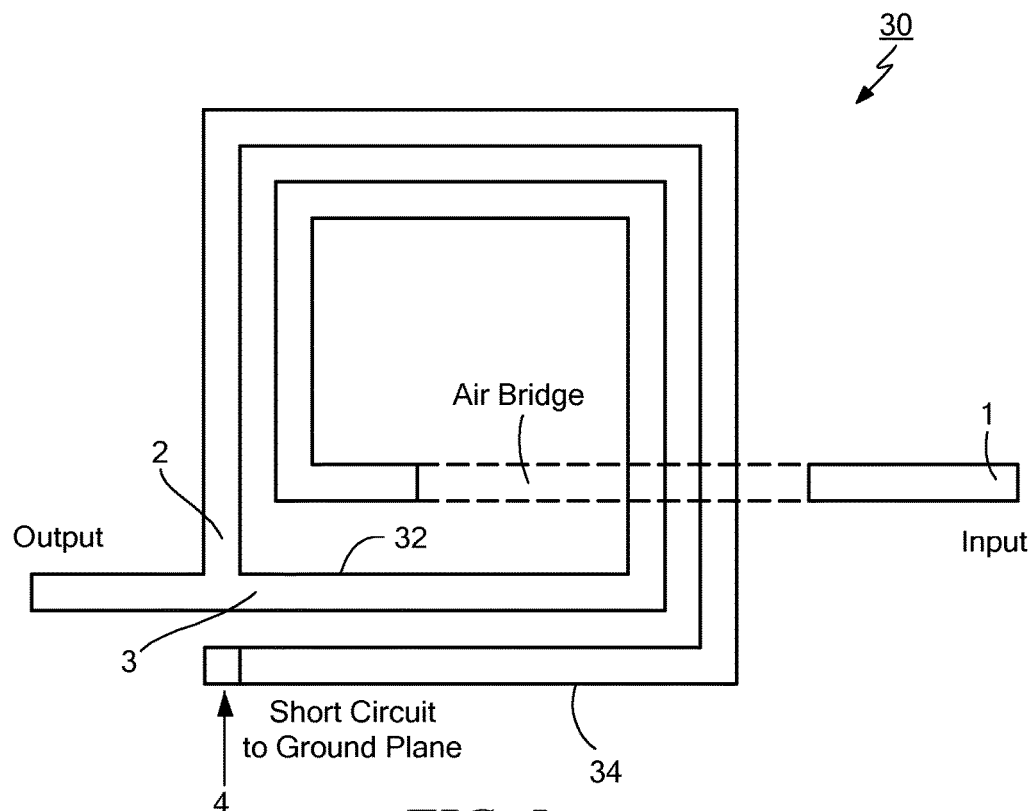
FIG. 5 is diagram of a known Ruthroff type TLT.
Figure 6:
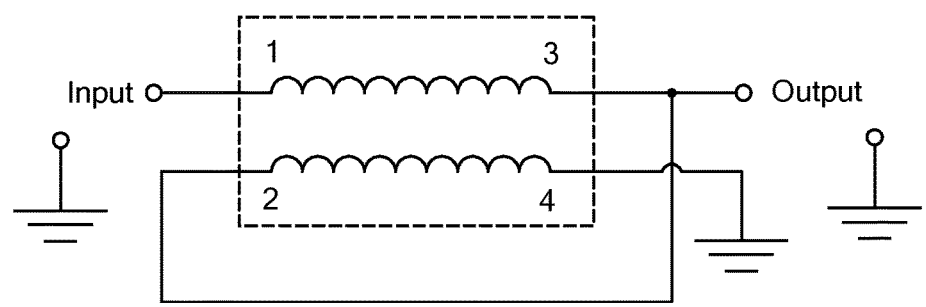
FIG. 6 is a circuit equivalent to the TLT of FIG. 5.

The TLTs of FIG. 9 are arranged so that magnetic fields cancel to cause suppression of common mode currents. For example, referring to FIG. 10, the common mode current in port 1 and 2 substantially cancels the common mode current in ports 5 and 6 An advantage of the TLT configuration of FIG. 9 over the TLT configuration of FIG. 3 is that the configuration of FIG. 9 permits a larger impedance transformation ratio to be achieved.

Thus, FIG. 9 shows a first pair of spiral conductors coaxial with a second pair of spiral conductors, and a third pair of spiral conductors, where the third pair of spiral conductors are substantially coplanar with the first pair of spiral conductors and substantially coaxial with a fourth pair of spiral conductors, where the fourth pair of spiral conductors are substantially coplanar with the second pair of spiral conductors. In one embodiment, the first and third pair of spiral conductors spiral inward in a counterclockwise direction and the second and fourth pair of spiral conductors spiral inward in a clockwise direction. The ports are connected as shown in FIG. 10 to obtain substantial suppression of common mode currents.

Figures 11, 12:
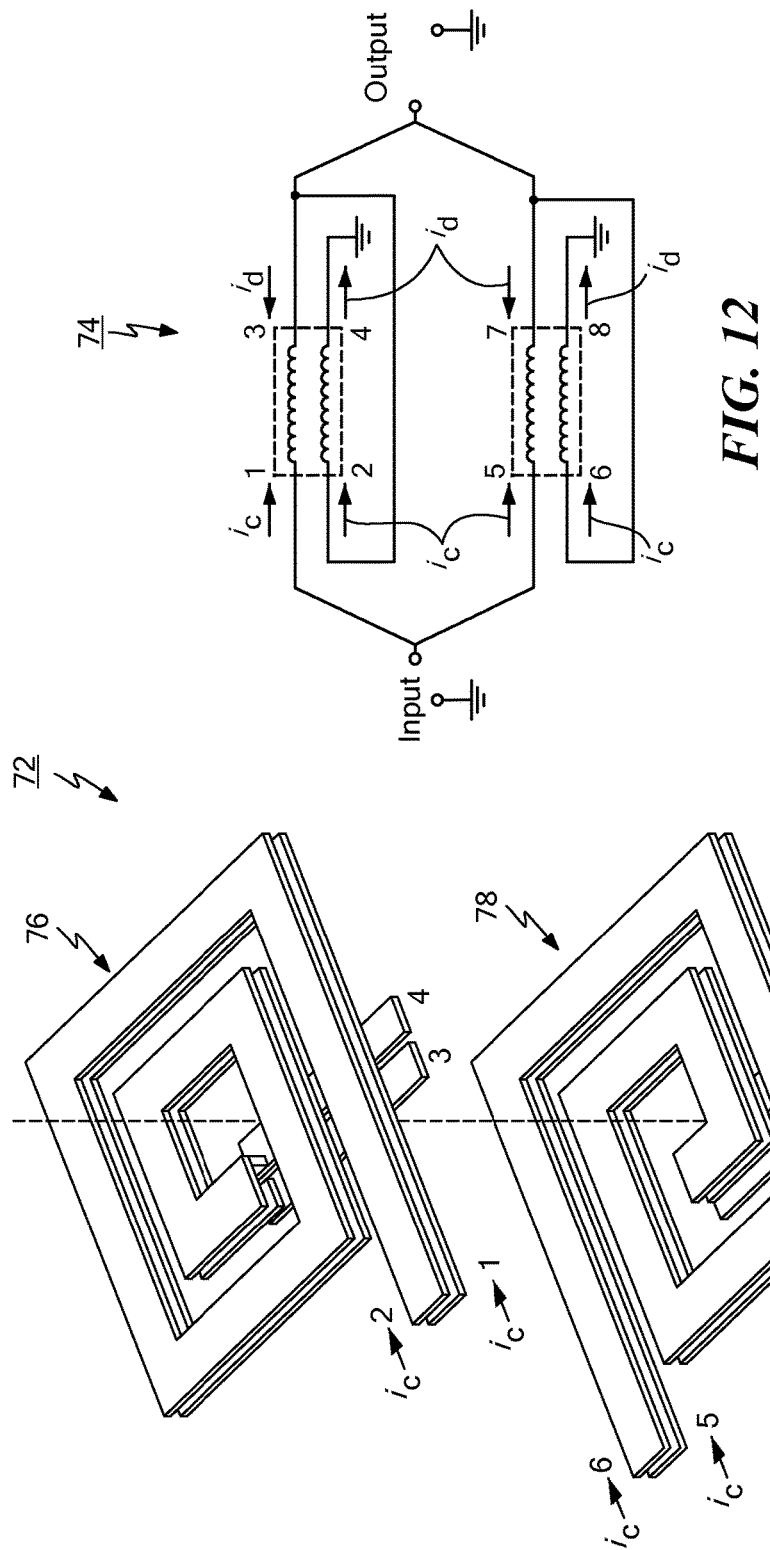
FIG. 11 is a diagram of a multilayer TLT constructed in accordance with principles of the present invention.
FIG. 12 is a circuit equivalent to the TLT of FIG. 11.

FIG. 11 is a TLT 72 of a pair of coaxial, oppositely-oriented Ruthroff elements that provides high common mode current rejection. FIG. 11 is similar to the configuration of FIG. 7, except that the ports are connected differently.

Not shown in FIG. 11 is that port 1 is connected to port 5 and port 2 is connected to port 3. Ports 4 and 8 are connected to a ground plane. Port 6 is connected to port 7. FIG. 12 shows an equivalent circuit 74 and the port connections corresponding to the arrangement of FIG. 11.

Figure 13:
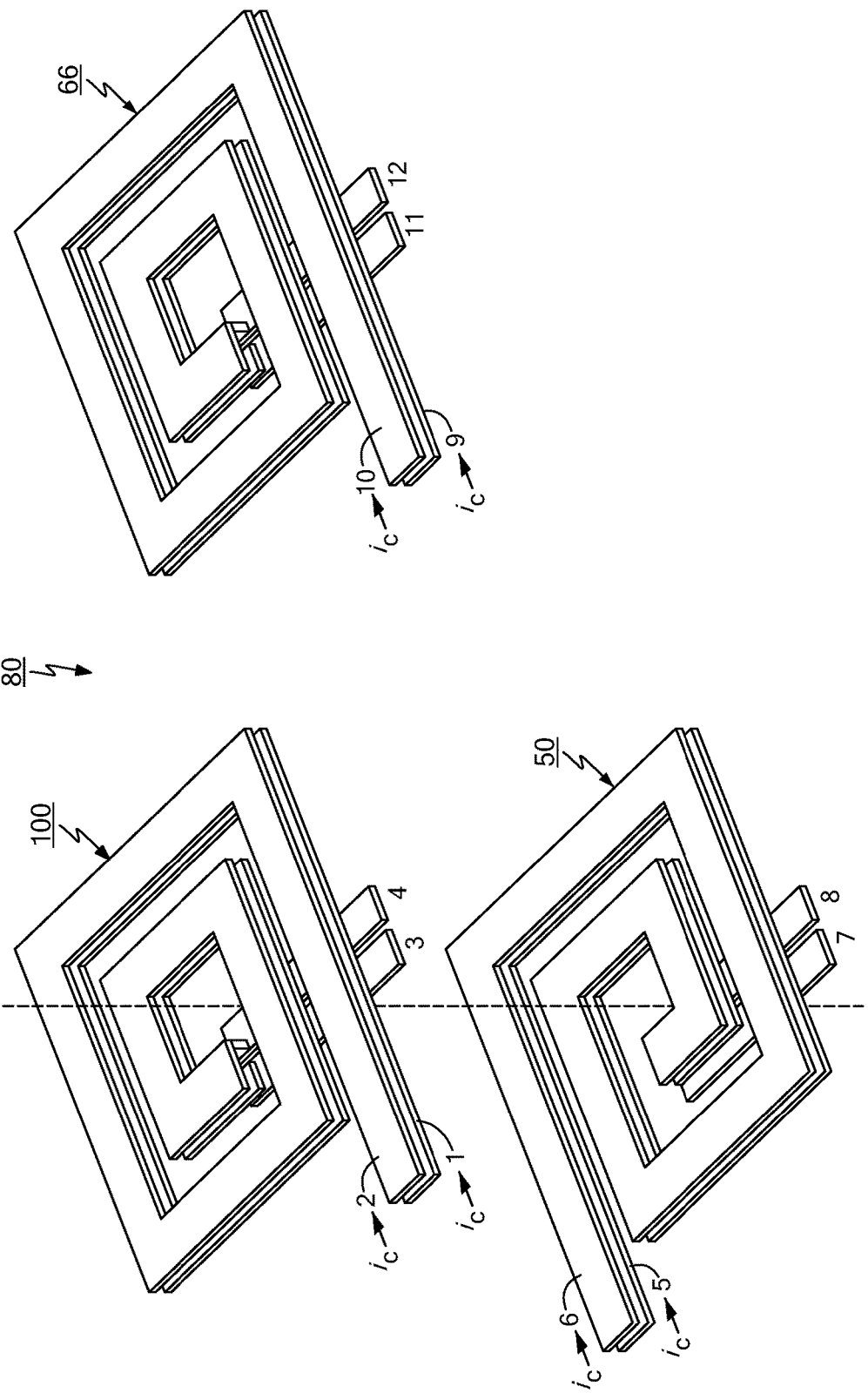
FIG. 13 is a diagram of a multilayer TLT constructed in accordance with principles of the present invention.
Figure 14:
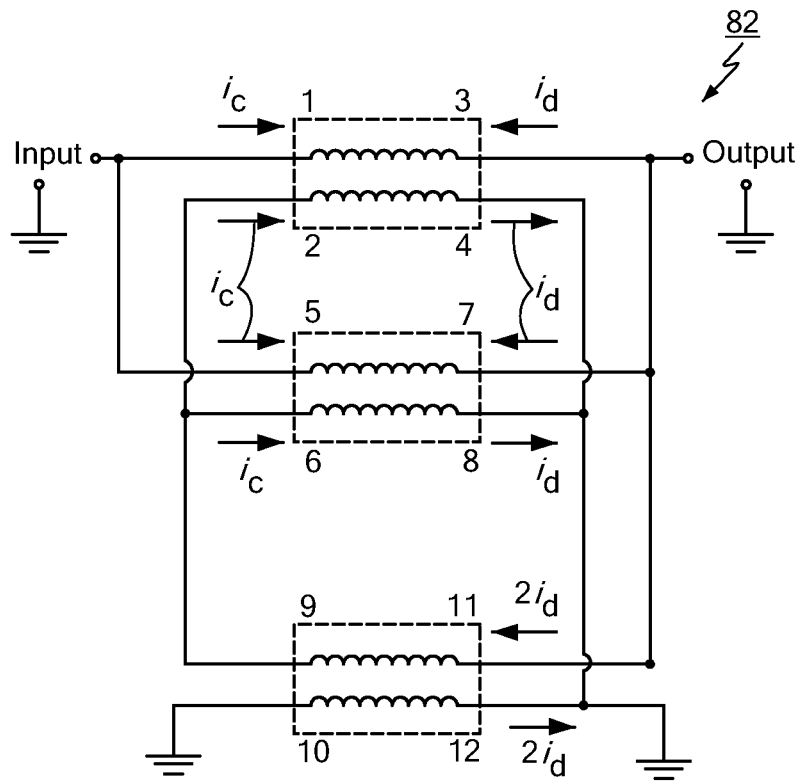
FIG. 14 is a circuit equivalent to the TLT of FIG. 13.

FIG. 13 is a TLT 80 that is similar to the TLT 52 of FIG. 9, except that the embodiment of FIG. 13 lacks the TLT 68. FIG. 14 shows a circuit 82 that is equivalent to the configuration of FIG. 13. FIG. 14 shows that port 1 is connected to port 5, port 2 is connected to ports 6 and 9, port 3 is connected to ports 7 and 11, and port 4 is connected to ports 8 and 12. Ports 4, 8, 10 and 12 are connected to a ground plane.

Figure 15:
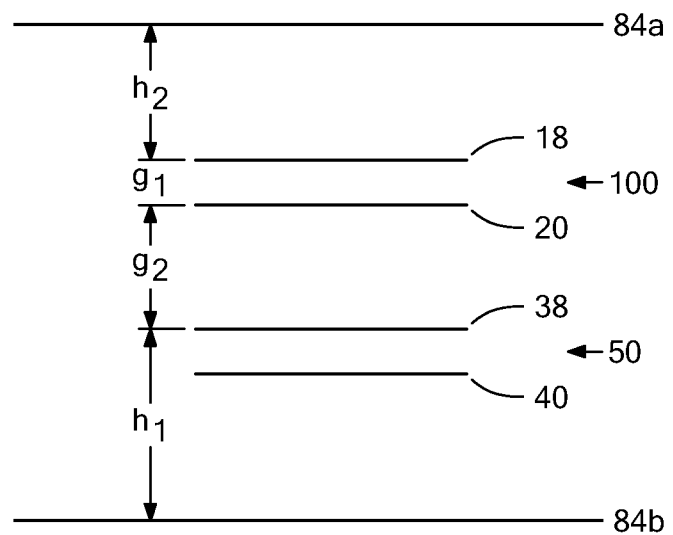
FIG. 15 is a diagram of a multilayered TLT between ground planes constructed in accordance with principles of the present invention.

The TLTs 100 and 50 may be placed above a ground plane and may be situated between ground planes. FIG. 15 shows the first pair of spiral conductors 18 and 20 above the second pair of spiral conductors 38 and 40. The conductors 18 and 20 may be placed on opposite side of a first dielectric slab that lays between the conductors 18 and 20. Both pairs of conductors are positioned between ground planes 84a and 84b. Increasing the distance between a TLT and a ground plane may increase the common mode current suppression. FIG. 15 is not to scale, but does illustrate that the conductors 18 and 20 are separated by a distance g1 that is smaller than a distance g2 between the TLTs 100 and 50. Similarly, the conductors 38 and 40 are separated by a distance that is smaller than the distance between the TLTs 100 and 50. The conductors 38 and 40 may be placed on opposite sides of a second dielectric slab that lays between the conductors 38 and 40. The first and second dielectric slabs may be substantially parallel. Further, the gap g1 is smaller than the gap h1 between the TLT 50 and the ground plane 84b. Also, the gap g1 is smaller than the gap h2 between the TLT 100 and the ground plane 84a.

Thus, embodiments include multilayer transmission line transformers that exhibit high common mode current suppression and high common mode impedance. In particular, one embodiment provides a method of manufacturing a wideband multilayer transmission line transformer. The method includes forming a first pair of spiral conductors on opposite sides of a first dielectric slab and forming a second pair of spiral conductors on opposite sides of a second dielectric slab that is substantially parallel to the first dielectric slab. The first and second pairs of spiral conductors are positioned to be substantially coaxial and to exhibit oppositely directed magnetic fields to substantially cancel common mode currents in each of the first and second pairs of spiral conductors when in operation.

In some embodiments, the method may include forming a third spiral conductor on the first side of the first dielectric slab substantially coplanar with the first spiral conductor. Further, a fourth spiral conductor may be formed on the second side of the first dielectric slab substantially coplanar with the second spiral conductor.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A multilayer transmission line transformer, comprising:
    a first set of two conductors having no intervening conductor there between, the first set of two conductors forming a first clockwise inward spiral, the first set of two conductors forming a first transformer; and a second set of two conductors having no intervening conductor there between, the second set of two conductors forming a second counterclockwise inward spiral, the second set of two conductors forming a second transformer, the second counterclockwise inward spiral being substantially coaxial with the first clockwise inward spiral; and the first and second inward spirals having no intervening conductor there between so that the combination of the first clockwise inward spirals and the second counterclockwise inward spirals being substantially coaxial cause a substantial cancellation of common mode currents in the first and second sets of conductors during operation without substantially suppressing differential mode currents.

2. The transformer of claim 1, wherein the two conductors of the first set of conductors are substantially physically parallel.

3. The transformer of claim 1, wherein the first set of conductors forms a Guanella transformer.

4. The transformer of claim 1, wherein the first set of conductors forms a Ruthroff transformer.

5. A transformer, comprising:
a first conductor in a first plane, the first conductor forming a first clockwise inward spiral;
a second conductor, proximal the first conductor, the second conductor forming a second clockwise inward spiral substantially coaxial with the first clockwise inward spiral, the first and second conductors forming a first transformer, there being no intervening conductor between the first and second conductors;
a third conductor, the third conductor forming a third counterclockwise inward spiral substantially coaxial with the first spiral, the third conductor provided in a second plane that is substantially parallel to the first plane; and
a fourth conductor proximal the third conductor, the fourth conductor forming a fourth counterclockwise inward spiral substantially coaxial with the third counterclockwise inward spiral, the third and fourth conductors forming a second transformer, there being no intervening conductor between the third and fourth conductors; and
the first and second transformers having no intervening conductor there between so that the orientation of the clockwise and counterclockwise inward spirals being substantially coaxial cause a substantial cancellation of common mode currents of the first and second transformers during operation without substantially suppressing differential mode currents.

6. The transformer of claim 5, wherein the first and second conductors are substantially physically parallel to each other, and wherein the third and fourth conductors are substantially physically parallel to each other.

7. The transformer of claim 5, wherein the first and second conductors form inductors having a first pair of mutually coupled inductive reactances.

8. The transformer of claim 7, wherein the second and third conductors form inductors having a second pair of mutually coupled inductive reactances.

9. The transformer of claim 8, wherein the first and second pair of inductive reactances cause the substantial cancellation of common mode currents through the first and second conductors.

10. A dual transformer, comprising:
a first clockwise inward spiral conductor forming a first inductor having a first inductive reactance;
a second clockwise inward spiral conductor forming a second inductor having a second inductive reactance mutually coupled to the first inductive reactance, to form a first transformer, there being no intervening conductor between the first and second clockwise inward spiral conductors;
a third counterclockwise inward spiral conductor forming a third inductor having a third inductive reactance, the third inductive reactance electrically in parallel with the first inductive reactance; and
a fourth clockwise inward spiral conductor forming a fourth inductor having a fourth inductive reactance electrically in parallel with the second inductive reactance, the fourth inductive reactance mutually coupled to the third inductive reactance, to form a second transformer, there being no intervening conductor between the third and fourth counterclockwise inward spiral conductors; and
the first input port connected to the third input port, the second input port connected to the first output port, and the fourth input port connected to the third output port; and
the first and second transformers having no intervening conductor there between so that the orientation of the clockwise and counterclockwise inward spirals being substantially coaxial cause a substantial cancellation of common mode currents of the first and second transformers during operation without substantially suppressing differential mode currents.

11. The transformer of claim 1, wherein a separation between the first set of two conductors and the second set of two conductors is greater than a separation between the two conductors forming one of the first and second sets.

12. The transformer of claim 1, wherein the first set of two conductors and the second set of two conductors are disposed between ground planes.

13. The transformer of claim 12, wherein a separation between a ground plane and a nearest one of the first and second set of conductors is greater than a separation of conductors in the nearest set.

14. The transformer of claim 5, wherein a separation between the second conductor and the third conductor is greater than a separation between the first conductor and the second conductor.

* * * * *